(12) United States Patent
Nagashima

(10) Patent No.: US 6,442,081 B1
(45) Date of Patent: Aug. 27, 2002

(54) SEMICONDUCTOR STORAGE DEVICE DATA SENSING METHOD AND APPARATUS

(75) Inventor: Hirokazu Nagashima, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/844,238

(22) Filed: Apr. 25, 2001

(30) Foreign Application Priority Data

Apr. 26, 2000 (JP) ......................................... 2000-131564

(51) Int. Cl.[7] ................................................ G11C 7/00
(52) U.S. Cl. .................... 365/189.09; 365/210; 365/207
(58) Field of Search ............................. 365/189.07, 94, 365/210, 189.09, 191, 196, 207, 221

(56) References Cited

U.S. PATENT DOCUMENTS

| 5,598,372 | A | * | 1/1997 | Matsumoto et al. | ... 365/230.01 |
| 6,297,624 | B1 | * | 10/2001 | Mitsui et al. | ............... 323/316 |

FOREIGN PATENT DOCUMENTS

| JP | 4-89691 | 3/1992 |
| JP | 7-201194 | 8/1995 |
| JP | 7-296593 | 11/1995 |
| JP | 11-176185 | 7/1999 |

OTHER PUBLICATIONS

English Bibliographies and Abstracts of JP 11–176185, JP 001194, JP 7–296593, JP 4–89691 (noted above).

* cited by examiner

Primary Examiner—Hoai Ho
Assistant Examiner—Thong Le
(74) Attorney, Agent, or Firm—Darryl G. Walker (57) ABSTRACT

A semiconductor memory device having serial access read mode including a latency period and a serial access period is provided. Semiconductor memory device (100) can include sense amplifier (110), a reference voltage generator (200), and a period detection circuit (101). Period detection circuit (101) can provide a control signal (RCL) indicating the latency period or the serial access period. Reference voltage generator (200) can provide a reference voltage (REF) having a first potential during the latency period and a second potential during the serial access period. In this manner, it may be possible to increase the speed of reading memory cell data by reducing the timing differences between reading a memory cell having a first data state and a memory cell having a second data state.

20 Claims, 4 Drawing Sheets

SEMICONDUCTOR STORAGE DEVICE DATA SENSING METHOD AND APPARATUS

TECHNICAL FIELD

The present invention relates generally to semiconductor memory devices and more particularly to a semiconductor memory device having a serial access mode that includes a latency period and a serial access period.

BACKGROUND OF THE INVENTION

In order to improve operation speeds, semiconductor memory devices can have a serial access mode of operation. In a serial access mode of operation, a read command is received by the semiconductor memory. Then, after a latency period, data is read out in a serial fashion.

A serial access mask ROM (read only memory) has a serial access mode of operation. When a serial access mask ROM receives a read command, a word line is activated based on a received address. The time required to activate the word line and access the first bits of data is defined as the latency period. The time to access subsequent bits of data in a sequential fashion can be called a serial access period. The data can be serially accessed synchronously with an external read clock signal that is applied to the semiconductor memory device.

In a semiconductor memory device having such a serial access mode, the data transfer speed can be improved by shortening the latency period. The latency period can be shortened by providing a faster access to the first bits of data. The data transfer speed can also be improved by shortening the access times during the serial access period.

Another factor in the design of a semiconductor memory device is chip size. In order to reduce chip size, the word line length is made as long as possible, which reduces the number of row decoders needed. Because bits are typically accessed serially from the same word line, lengthening the word line can also allow more bits to be serially accessed in one serial access mode operation. However, this can effect the latency period because a longer word line is slower to rise due to the larger resistive and capacitive load.

Memory cells in a serial access mask ROM can be programmed in one of two different states. The programmed state indicates whether the data value stored in the memory cell is logic one or logic zero. The states of the memory cell can be termed as an ON-cell or an OFF-cell. An on-cell is a memory cell that has been programmed to be conductive when selected by a word line. An OFF-cell is a memory cell that has been programmed to be non-conductive when selected by a word line. Each memory cell is typically an n-channel insulated gate field effect transistor (IGFET), which can be programmed to be an OFF-cell by programming a high threshold voltage or to be an ON-cell by programming a low threshold voltage. This can be done with an ion implantation step, as just one example. In this example, it is assumed that the memory cell is a NAND type cell.

An example of a conventional serial access mask ROM will now be described with reference to a sense amplifier set forth in FIG. 3 and a timing diagram set forth in FIG. 5. The conventional serial access mask ROM has a serial mode of operation in which there is a latency period and serial access period.

Figure 3:
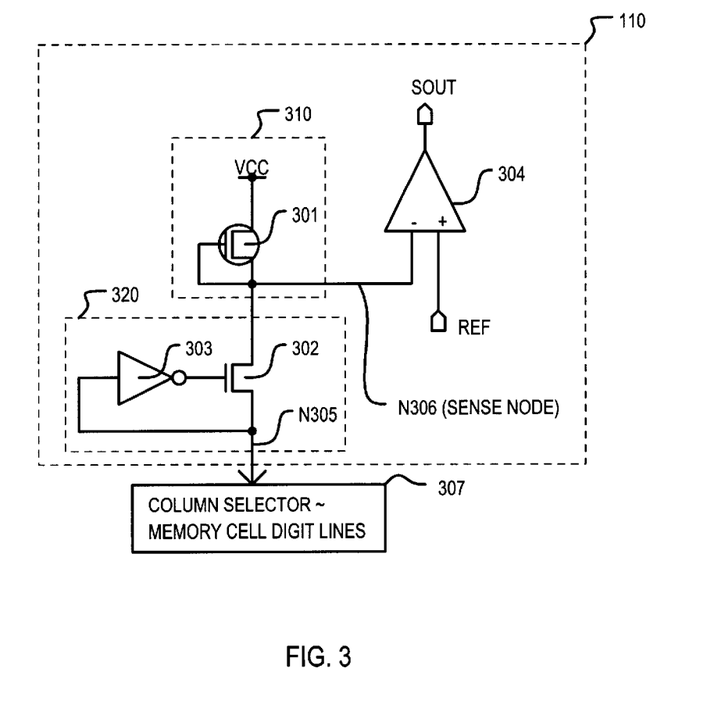
FIG. 3 is a circuit schematic diagram of a sense amplifier.

Referring now to FIG. 3, a sense amplifier is set forth in a circuit schematic diagram and given the general reference 110. The sense amplifier detects whether a selected memory cell is an ON-cell or an OFF-cell by comparing a sense level at a sense node N306 with a reference voltage REF. This is done by having sense node N306 and reference voltage REF as inputs to differential amplifier 304. Differential amplifier 304 provides a data output SOUT based on the comparison. In the conventional serial mask ROM, the reference voltage is at a midpoint of the voltage swing of the sense node N306.

Differential amplifier 304 can be electrically connected to a selected memory cell by a column selector and memory cell digit lines 307 by way of a input node N305. When a memory cell is selected, the state of the memory cell (ON-bit or OFF-bit) determines the potential of sense node N306.

Figure 5:
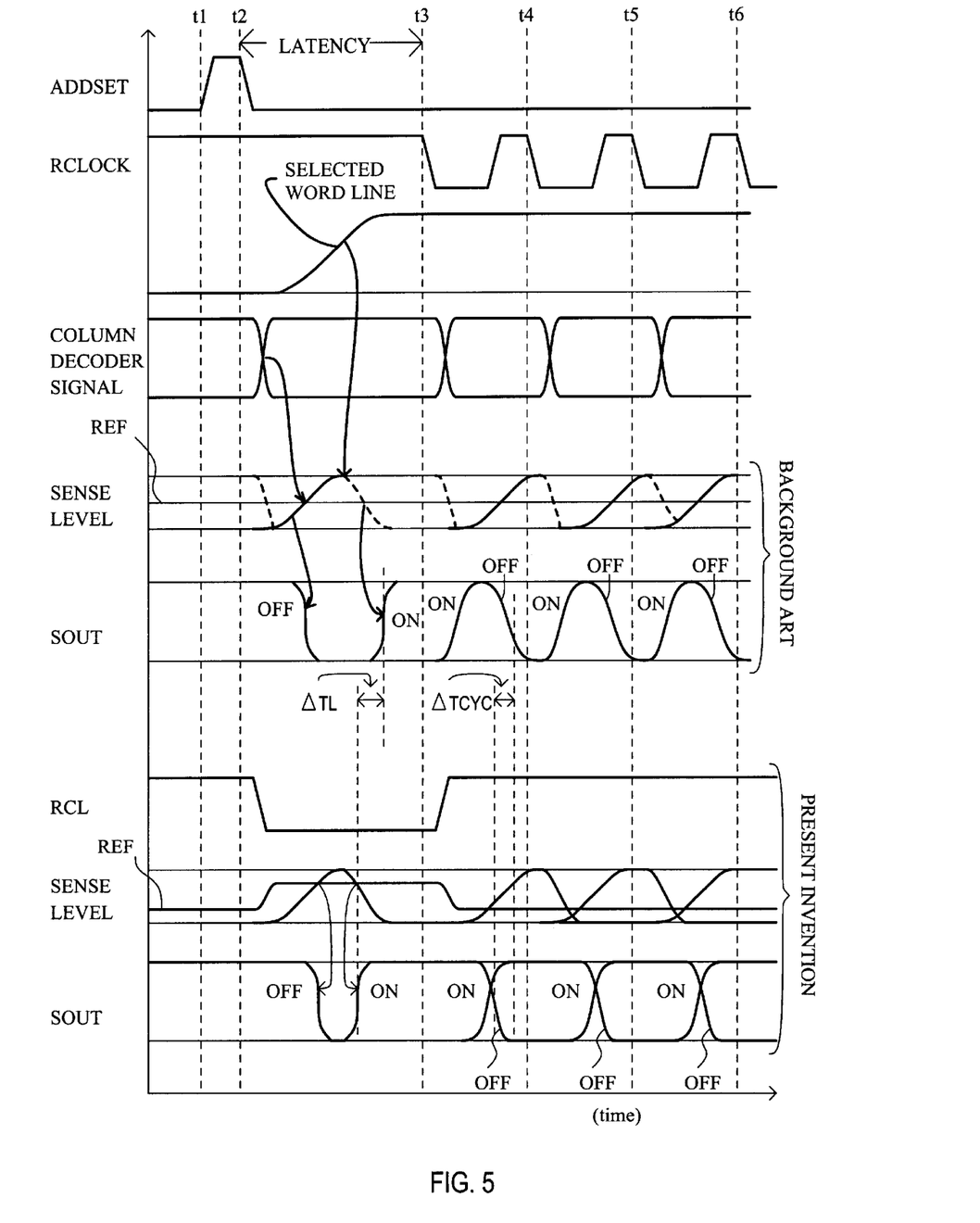
FIG. 5 is a timing diagram illustrating signals in a serial access read operation according to one embodiment and signals in a conventional serial access read operation.

Referring now to FIG. 5, waveforms indicating a serial access mode operation of a conventional serial access ROM are set forth. The waveforms pertaining to a serial access mode operation of a conventional serial access ROM are labeled as "BACKGROUND ART."

FIG. 5 represents a serial access mode read operation and illustrates the latency period and serial access period.

At time t2, conventional serial access ROM enters the latency period in which a word line is selected based on the address that has been applied. It is noted that in the conventional serial access ROM, digit lines adjacent to the digit line associated with the selected cell are discharged to ground in order to prevent excessively charging of digit lines.

Thus, at time t2, based on the received row address, a word line is selected. At the same time, a digit line is selected based on a received column address. Thus, the selected word line can begin to rise. The potential of the selected digit line can begin to rise also. This is due to the p-channel load IGFET 301 in the sense amplifier 110 illustrated in FIG. 3. However, due to the word line having a larger capacitive and/or resistive load, the selected word line rises at a slower rate than the selected digit line.

Assuming that the first bit read during the latency period is an ON-cell, once the word line achieves a high enough voltage to turn on the n-channel IGFET memory cell, the selected digit line begins to discharge. It is noted that because the digit-line charges up during the precharge period before the word line rises to a sufficient level to turn on the ON-bit selected memory cell, the sense node N306 can achieve a relatively high precharge voltage.

After the word line reaches a high enough voltage for the selected ON-cell to conduct, the digit line can be discharged toward a ground level. This can be seen as dashed line of SENSE LEVEL signal (corresponding to sense node N306) in the BACKGROUND art waveforms of FIG. 5. When the sense node N306 reaches a level below the voltage reference REF, the sense amplifier 110 can correctly produce a sense amp output SOUT at a logic level (high in this case) corresponding to an ON-bit cell.

Next, at time t3, a clock RCLOCK makes a transition, which is the beginning of the serial access portion of the serial access mode. A column address is incremented and a different digit line is selected. During this read cycle, the memory cell associated with the selected digit line and already selected word line is an off-bit cell. The OFF-bit cell does not conduct current and the digit line can be pulled up by the p-channel load transistor 301. Once the SENSE LEVEL signal (sense node N306) reaches a voltage level above the voltage reference REF, the sense amplifier 110 can correctly produce a sense amp output SOUT at a logic level (low in this case) corresponding to an OFF-bit cell.

It is noted that the drive strength of p-channel load transistor 301 decreases as the digit line rises. This is because the gate to source voltage is decreased. Thus, although the digit line may rise relatively fast at first, the drive strength can decrease as the digit line potential gets closer to the reference voltage VREF. Thus, the reading of the OFF-bit cell can be slow.

Illustrated in the read cycle between times t3 and t4, is a dashed waveform which can correspond to an ON-bit cell being read. It can be seen from the sense amp output SOUT, that an ON-bit cell can be read faster than an OFF-bit cell in the serial access portion of a serial access mode. However, compared to the latency portion, it can be seen from the sense amp output SOUT, that an OFF-bit cell is read faster than an ON-bit cell in the serial access portion of a serial access mode.

The access time of a semiconductor memory device is determined by the slowest bit read. Thus, the access time is limited when one type of bit is read more slowly under certain conditions.

In view of the above discussion, it would be desirable to provide a semiconductor device having a serial access mode of operation in which access times may be improved during the latency portion. It would also be desirable to provide improved access times during a serial access portion.

SUMMARY OF THE INVENTION

According to the present embodiments, a semiconductor memory device having serial access read mode including a latency period and serial access period is provided. The semiconductor memory device can include a sense amplifier receiving a reference voltage having a first potential during the latency period and a second potential during the serial access period.

According to one aspect of the embodiments, the reference voltage can have a higher potential in the latency period than in the serial access period.

According to another aspect of the embodiments, the semiconductor memory device can include a reference voltage generator. The reference voltage generator can receive a control signal and may provide a reference voltage having a potential determined by the logic level of the control signal.

According to another aspect of the embodiments, the reference voltage generator can include a load circuit coupled between a supply voltage and a reference voltage. The load circuit can have a first impedance when a control signal is at a first logic level and a second impedance when the control signal is at a second logic level. The first impedance can be less than the second impedance.

According to another aspect of the embodiments, the reference voltage generator can include a load circuit providing the reference potential according to a load current. The reference voltage generator can also include a selection circuit for providing a first load current when the control signal is at the first logic level and a second load current when the control signal is at a second logic level.

According to another aspect of the embodiments, the first load current can be determined by the impedance of a first dummy memory cell. The second load current can be determined by the impedance of a second dummy memory cell.

According to another aspect of the embodiments, the semiconductor memory device can be a read only memory.

According to another aspect of the embodiments, the semiconductor memory device can have a read operation including a first bit access and a subsequent bit access and the sense amplifier can receive a different reference voltage on the first bit access than on the subsequent bit access.

According to another aspect of the embodiments, the sense amplifier can receive a data signal. The data signal may have a data signal switching range based on opposite states of a memory cell. The reference voltage potential can be higher than the mid-point of the data signal switching range during the latency period.

According to another aspect of the embodiments, the reference potential can be lower than the mid-point of the data signal switching range during the serial access period.

According to another aspect of the embodiments, the semiconductor memory device can include a control circuit generating a control signal having a logic level determined by whether the semiconductor memory device is in the latency period or the serial access period.

According to another aspect of the embodiments, the control circuit can detect the latency period by detecting an external address load operation.

According to another aspect of the embodiments, the control circuit can include a latch circuit for latching a logic level when an external clock transitions, signaling the end of the latency period.

According to another aspect of the embodiments, the control circuit can receive an address set signal and a read clock signal and may produce a control signal indicating whether a serial access read operation is in the latency period or serial access period.

DETAILED DESCRIPTION OF THE EMBODIMENTS

Various embodiments of the present invention will now be described in detail with reference to a number of drawings.

Figure 1:
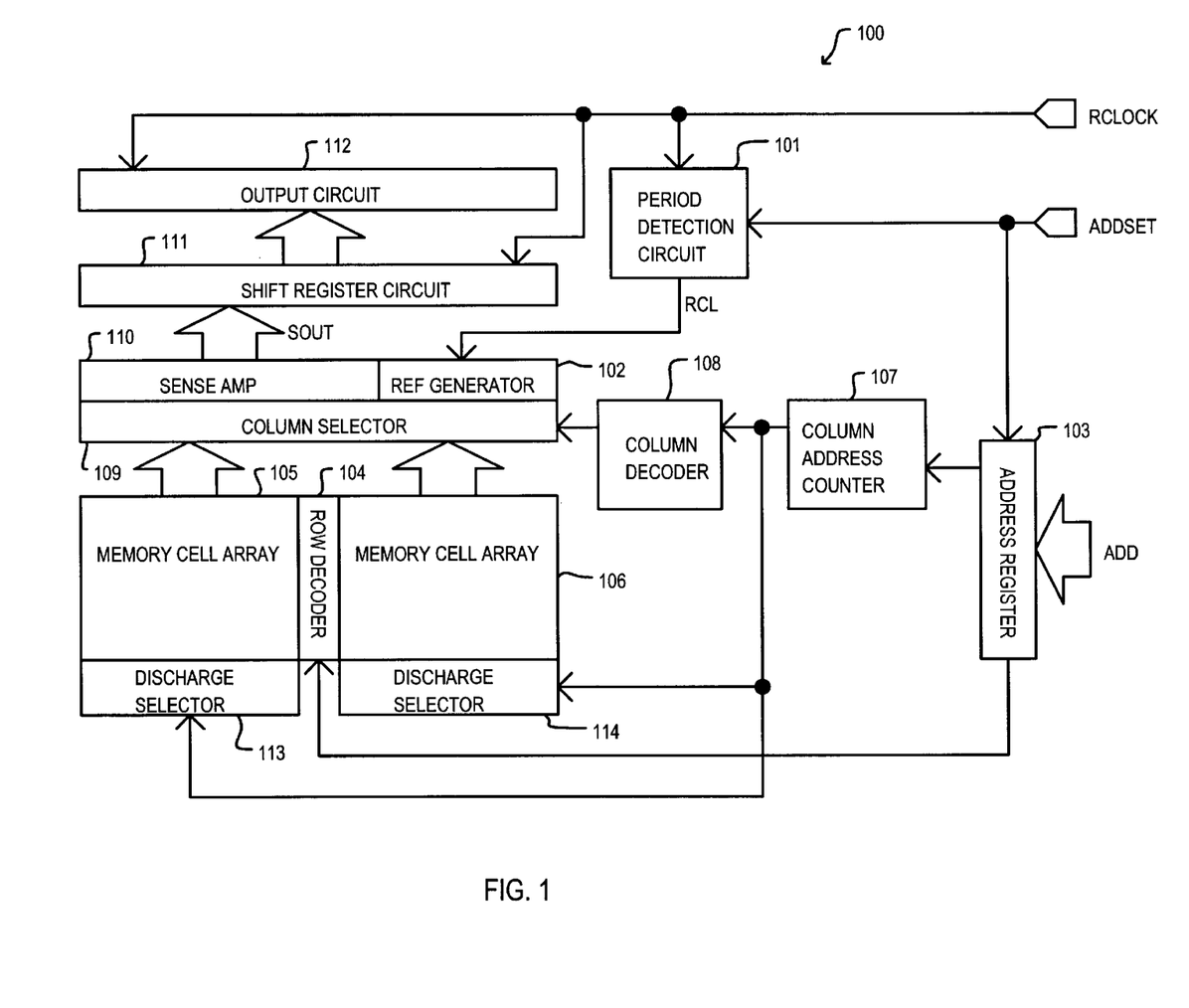
FIG. 1 is a block schematic diagram of a semiconductor memory device according to one embodiment.

Referring now to FIG. 1, a semiconductor memory device according to one embodiment is set forth in a block schematic diagram and given the general reference character 100.

Semiconductor memory device 100 can include a period detection circuit 101 coupled to receive a read clock signal RCLOCK and an address set signal ADDSET. Period detection circuit 101 can generate a control signal RCL. Control signal RCL can indicate whether a serial access operation is in a latency period or a serial access period.

Semiconductor memory device 100 can also include an address register 103 coupled to receive an external address ADD and address set signal ADDSET. Address register 103 can provide latched addresses to a column address counter 107 and a row decoder 104. Row decoder 104 can be coupled to memory cell arrays 105 and 106 and may activate a selected word line during an access operation.

Column address counter 107 can receive read clock signal and at least a portion of the latched address and provide an address to a column decoder 108 and discharge selector 114. Discharge selector 114 may discharge digit lines that are not selected in the read operation. Column decoder 108 can provide an output to column selector 109. Column selector 109 may select a digit line or a group of digit lines in memory cell arrays 105 and 106.

Sense amplifier 110 can be coupled to column selector 109 and reference generator 102. Column selector 109 can selectively couple a digit line to sense amplifier 110. Reference generator 102 can receive a control signal RCL from period detection circuit 101 and provide a reference voltage that may have a different potential based on the value of control signal RCL. Sense amplifier 110 can provide an output SOUT based on the potential of the selectively coupled digit line and the reference voltage. When period detection circuit 101 provides a control signal RCL that indicates that a serial access operation is in a latency period, reference generator 102 may provide a reference voltage having a first potential. The first potential may be greater than the midpoint of the voltage swing of a sense node, as just one example. When period detection circuit 101 provides a control signal RCL that indicates that a serial access operation is in a serial period, reference generator 102 may provide a reference voltage having a second potential. The second potential may be less than the midpoint of the voltage swing of a sense node, as just one example.

Shift register circuit 111 can receive sense amplifier output SOUT and read clock signal RCLOCK and may provide an output signal to output circuit 112. Output circuit 112 may provide output data externally from the semiconductor memory device 100.

Referring now to FIG. 5, a timing diagram is set forth illustrating various signals of an embodiment of the present invention in a serial read operation.

First, at time t1 an address can be loaded into address register 103. At time t2, address set signal ADDSET may transition to a logic low level and the address may be latched and output to row decoder 104 and column address counter 107. Row decoder 104 may receive the latched address and activate a word line in at least one of memory arrays (105 and 106). At the same time, discharge selector (113 and 114) may receive a column portion of the address and may release a selected digit line to allow it to be precharged. Precharging a digit line may include charging up the digit line through a load device coupled to a high voltage supply. Other digit lines may be held to a ground level by discharge selector (113 and 114). A selected digit line begins to rise, resulting in a sense node N306 (illustrated in FIG. 3) rising, as illustrated after t2.

Also at time t2, when address set signal transitions to a low logic level, period detection circuit 101 can provide a control signal RCL that is a low logic level. This can indicate a latency period of the serial read operation. Reference generator 102 may then generate a reference voltage REF having a higher potential.

It is noted before time t2, semiconductor memory device 100 may be completing a previous serial read operation and the period detection circuit 101 can provide a control signal RCL that is in a state indicating a serial read period. When control signal RCL is logic high, a serial read period may be indicated.

Reference voltage REF may be an input into sense amplifier 110 which determines the potential level at which a selected memory cell will be sensed as an ON-bit or an OFF-bit.

In the latency period illustrated in FIG. 5, the selected memory cell can be an ON-bit. With an increased reference voltage REF, when the selected memory cell (which is an ON-bit) conducts, the potential of the digit line and sense node N306 can be pulled below the reference voltage in a shorter time than in the conventional case (illustrated in BACKGROUND ART waveforms). It is noted that the word line can provide a relatively high load and thus may rise at a slower rate than the digit line and/or sense node N306 can be precharged. Thus, increasing the reference voltage REF may not delay the effective reading of an OFF-bit because the access time can be determined by the slowest access and an OFF-bit may still be accessed more quickly than an ON-bit.

In this manner, the access time improvement for the latency period access (first bit access) can be improved by ΔTL as compared to the conventional approach.

Next, at time t3, read clock RCLOCK may transition from a high logic level to a low logic level. Column address counter 107 can detect this transition, causing the column address to be internally incremented. In this manner column decoder 108 may select a different portion of column selector 109, which selects a different digit line. The newly selected digit line may be coupled to a selected memory cell that is an OFF-bit. At the same time, the incremented column address may be applied to the discharge selector (113 and 114). Discharge selector (113 and 114) may release the selected digit line, thus allowing it to be precharged. In this manner, the selected digit line may begin to rise and thus the sense node N306 may begin to rise.

Also, at time t3, when read clock RCLOCK transitions from a high logic level to a low logic level, period detection circuit 101 may provide a control signal RCL that becomes logic high. This may indicate that semiconductor memory device 100 is operating in a serial access period of the serial access mode. Reference generator 102 may then generate a reference voltage REF having a lower potential.

In the serial access period illustrated in FIG. 5, the selected memory cell can be an OFF-bit. With the selected memory cell being an OFF-bit, digit line may continue to rise due to precharging. With a decreased reference voltage REF, the potential of the digit line and sense node N306 can be pulled above the reference voltage REF in a shorter time than in the conventional case (illustrated in BACKGROUND ART waveforms). It is noted that if the selected memory cell was an ON-bit, the digit line would remain pulled low and the potential would be below the reference voltage REF. Thus, decreasing the reference voltage REF may not delay the effective reading of an ON-bit because the access time can be determined by the slowest access and an ON-bit may still be accessed more quickly than an OFF-bit during the serial access period.

In this manner, the access time improvement for the serial access period (subsequent bit accesses) can be improved by ΔTCYC as compared to the conventional approach.

Period detection circuit 101 may continue to provide a control signal RCL which may be logic high until address set signal ADDSET indicates another address is to be latched for the beginning of a new serial access read. Thus, reference voltage generator 102 may continue to provide a lower reference voltage REF to sense amplifier 110.

Subsequent read cycles in the serial access period may operate in a similar manner.

Access times may be improved by generating a reference voltage REF selected to favor a data value stored in a memory cell that may be read out more slowly than another data value. Thus, reference voltage REF may be changed to favor the predetermined data. The predetermined data may be a different data value when different access conditions exist. In the embodiment discussed above, an ON-bit may be favored during a latency period and an OFF-bit may be favored during a serial access period.

In the above-described embodiment, a more uniform access time may be obtained for different logic values stored in a memory cell as compared to the conventional approach.

Figure 2:
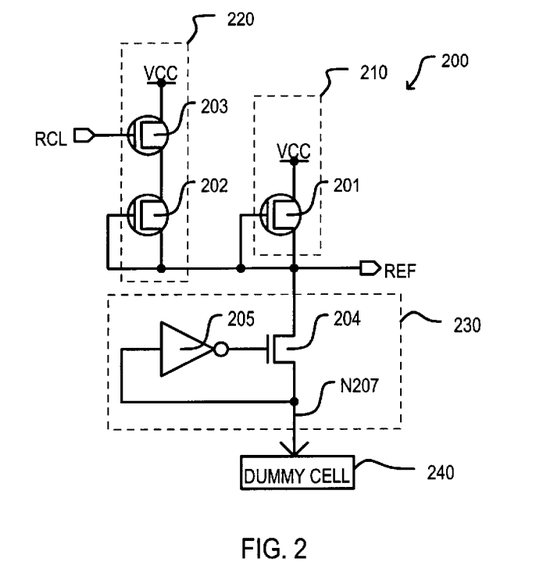
FIG. 2 is a circuit schematic diagram of a reference voltage generator according to one embodiment.

Referring now to FIG. 2, a reference voltage generator according to an embodiment is set forth in a circuit schematic diagram and given the general reference character 200. Reference voltage generator 200 of FIG. 2 may be used as reference voltage generator 102 in the embodiment of FIG. 1.

Reference voltage generator 200 can include load circuits (210 and 220), a feedback circuit 230, and a dummy cell 240.

Load circuit 210 can be coupled between a supply voltage VCC and reference voltage REF. Load circuit 220 may be coupled between supply voltage VCC and reference voltage REF. Feedback circuit 230 may be coupled between reference voltage REF and dummy cell 240.

Load circuit 210 may include a load transistor 201, which may have a source connected to supply voltage VCC, and a drain and gate connected to reference voltage REF. Load transistor 210 may be a p-channel IGFET, as just one example. In this manner, load circuit may provide an impedance path between reference voltage REF and supply voltage VCC.

Load circuit 220 may include a load enable transistor 203 and a load transistor 202. Load enable transistor 203 may have a source connected to supply voltage VCC and a drain connected to the source of a load transistor 202. Load enable transistor 203 may receive control signal RCL at a control gate. Load transistor 202 may have a drain and gate connected to reference voltage REF. Load transistor 202 and load enable transistor 203 may be p-channel IGFETs, as just one example.

Feedback circuit 230 may include a transistor 204 and inverter 205. Transistor 204 may have a source connected to dummy cell 240, a drain connected to reference voltage REF, and a gate connected to the output of inverter 205. Inverter 205 may have its input connected to the source of transistor 204 and dummy cell.

The operation of reference voltage generator 200 will now be described.

Feedback circuit 230 can be used to limit the voltage of dummy digit line N207. If dummy digit line N207 has a potential above the threshold voltage of inverter 205, a low logic level may be applied to the control gate of transistor 204, thus turning it off. This can limit the potential of dummy digit line N207 to the threshold voltage of inverter 205 and may set this level as a quiescent operating point. This may conserve power.

When reference voltage generator 200 is enabled, dummy cell 240 can conduct current. This can allow dummy digit line N207 to be pulled toward a low potential, thus inverter 205 may provide a high output to the control gate of transistor 204. This can allow transistor 204 to be in a conducting state.

The operation of reference voltage generator 200 when semiconductor memory device 100 is operating in a serial access period will now be explained.

During the serial access period, control signal RCL can be logic high. With control signal RCL at logic high, load enable transistor 203 can be turned off thus disabling load circuit 220. Thus, the reference voltage REF can be determined by a ratio of the conductive resistance of transistor 204 and the resistance of load circuit 210. The reference voltage generator 200 may be designed so that the conductive resistance of transistor 204 is less than the conductive resistance of load circuit 210. This can allow reference voltage REF to have a potential that is reduced as illustrated in the serial access period of FIG. 5. It is noted that the conductive resistance of dummy cell 240 may be considered when providing the above-mentioned ratio.

Now the operation of reference voltage generator 200 when semiconductor memory device 100 is operating in a latency period will be explained.

During the serial access period, control signal RCL can be logic low. With control signal RCL at logic high, load enable transistor 203 can be turned on thus enabling load circuit 220. Thus, the reference voltage REF can be determined by a ratio provided by the conductive resistance of transistors 204 and a load resistance determined by the resistance of load circuits 210 and 220 operating in parallel. The reference voltage generator 200 may be designed so that the conductive resistance of transistor 204 is greater than the conductive resistance of load circuits 210 and 220 operating in parallel. This can allow reference voltage REF to have a potential that is raised as illustrated in the latency period of FIG. 5. It is noted that the conductive resistance of dummy cell 240 may be considered when providing the above-mentioned ratio.

It should be noted that the potential of the reference voltage REF may be determined by a relationship between the resistance of load circuit (210 and 220) and the resistance of transistor 204 and dummy cell 240. Thus, by varying the above-mentioned resistances, the potential of reference voltage REF may be set to a desired level for both the serial access period and latency period.

Referring now to FIG. 3, a sense amplifier 110 is set forth in a circuit schematic diagram.

Sense amplifier 110 may include a differential amplifier 304, a load circuit 310 and a feedback circuit 320.

Differential amplifier 304 may receive reference voltage REF at one input and a sense node N306 at another input. Differential amplifier 304 may provide a data output signal SOUT.

Load circuit 310 may be connected between a power supply VCC and the sense node N306. Load circuit 310 may include a load transistor 301. Load transistor 301 may have a source connected to the power supply VCC and a drain and gate connected to sense node N306. Load transistor 301 may be a p-channel IGFET, as just one example.

Feedback circuit 320 may include a transistor 302 and inverter 303. Transistor 302 may have a source connected to a sense amplifier input node N305, a drain connected to sense node N306, and a gate connected to the output of inverter 303. Inverter 303 may have its input connected to the source of transistor 302 and sense amplifier input node N305.

Sense amplifier 110 can receive a data input signal from a selected digit line at sense amplifier input node N305 from column selector and digit lines 307.

The operation of sense amplifier 110 will now be described.

Feedback circuit 320 can be used to limit the voltage of sense amplifier input node N305. If sense amplifier input node N305 has a potential above the threshold voltage of inverter 303, a low logic level may be applied to the control gate of transistor 302, thus turning it off. This can limit the potential of sense amplifier input node N305 to the threshold voltage of inverter 205 and may set this level as a quiescent operating point. Because the sense amplifier input node N305 may be electrically connected to a selected digit line (which can have a relatively large capacitance), the voltage of the digit line can also be limited. This may conserve power by minimizing the amount of current flowing through digit line and sense amplifier 110.

When a memory cell is selected that is an ON-bit, a small current may flow through the memory cell to ground. This can allow a small current to flow through load circuit 310 which may lower the potential of sense node N306. When the potential of sense node N306 is below the reference voltage REF, the ON-bit is detected and logic one may be output at sense amplifier output SOUT.

When a memory cell is selected that is an OFF-bit, current may not flow through the memory cell to ground. This can allow load circuit 310 to increase potential of sense node N306. When the potential of sense node N306 is above the reference voltage REF, the OFF-bit is detected and logic zero may be output at sense amplifier output SOUT.

It is noted that differential amplifier 304 may be designed to sense very small voltage differentials. In this manner, sense amplifier 110 may provide reliable sensing even when current in an ON-bit is very small.

The operating potential of sense node N306 can be dependent upon the ratio of the impedance of load circuit 310 and impedance provided by transistor 302 of feedback circuit. This ratio may provide an operating potential in which an ON-bit may provide a lower potential at sense node N306 than the reference potential REF (for both the latency period and serial access period). The ratio may also provide an operating potential in which an OFF-bit may provide a higher potential at sense node N306 than the reference potential REF (for both the latency period and serial access period).

Figure 4:
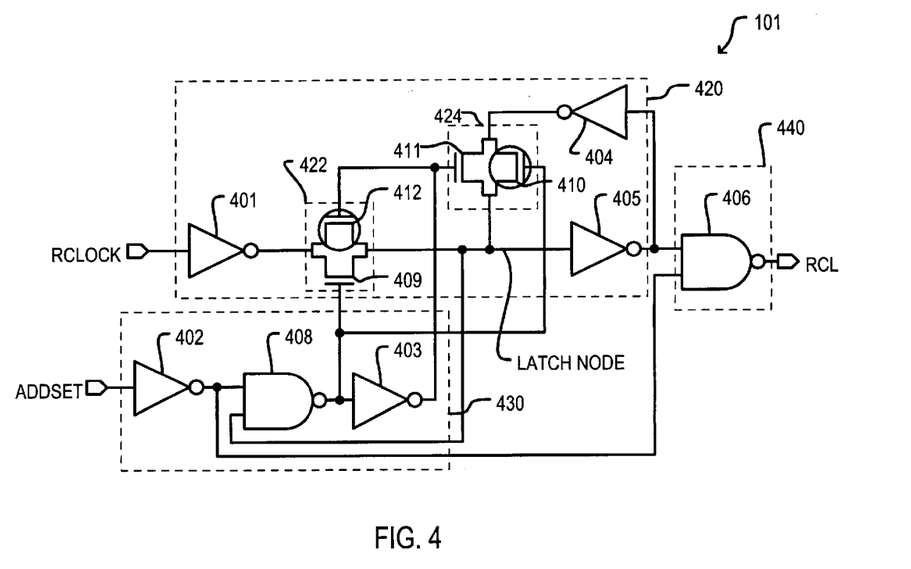
FIG. 4 is a circuit schematic diagram of a period detection circuit according to one embodiment.

The structure and operation of period detection circuit 101 will now be explained.

Referring now to FIG. 4, period detection circuit 101 according to an embodiment is set forth in a block schematic diagram.

Period detection circuit 101 can include a latch circuit 420, a control circuit 430 and a period output circuit 440.

Latch circuit can receive read clock signal RCLOCK and outputs from control circuit 430 and may provide an input to period output circuit 440. Latch circuit 430 can include inverters (401, 404, and 405) and transfer gates (422 and 424). Inverter 401 may have an input connected to receive read clock signal RCLOCK and may have an output connected to an input of transfer gate 422. Transfer gate 422 may receive control signals from control circuit 430 and may have an output connected to an input of inverter 405. Transfer gate 422 can include transistors 409 and 412. Transistor 409 may be an n-channel IGFET and transistor 412 may be a p-channel IGFET. Inverter 405 can have an output connected to an input of inverter 404 and an input of output circuit 440. Inverter 404 can have an output connected to an input of transfer gate 424. Transfer gate 424 may receive control signals from control circuit 430 and can have an output connected to the input of inverter 405 and output of transfer gate 422. Transfer gate 424 can include transistors 410 and 411. Transistor 410 may be a p-channel IGFET and transistor 411 may be an n-channel IGFET.

Control circuit 430 can receive address set signal ADDSET and a latched signal as an input and may provide control signals to latch circuit 420 and period output circuit 440. Control circuit 430 can include inverters (402 and 403) and NAND gate 408. Inverter 402 can receive address set signal ADDSET as an input and can provide an output to NAND gate 408 and detection output circuit 440. NAND gate 408 can also receive a latched signal from latch circuit 420 and can provide a control output to transfer gates (422 and 424) of latch circuit 420. Inverter 403 can also provide a control output to transfer gates (422 and 424) of latch circuit 420.

Period output circuit 440 can receive a control signal from control circuit 430 and an output from latch circuit 420 and can provide control signal RCL as an output. Period output circuit 440 can include NAND gate 406.

The operation of period detection circuit 101 will now be described with reference to FIGS. 4 and 5.

At time t1 of FIG. 5, address set signal ADDSET can transition to logic high while read clock signal RCLOCK can be logic high. This can indicate an address load operation, which may load an external address to be used in a serial access read operation. With address set signal ADDSET logic high, the output of inverter 402 may go low. This logic low can be input to period output circuit 440, which may force the output of NAND gate 406 high. Thus, control signal RCL can be logic high at this time.

Also, the logic low from inverter 402 can be input to NAND gate 408 which can provide a logic high output. In this manner, logic high can be applied to the control gate of transistor 409 and a logic low (through inverter 403) can be applied to the control gate of transistor 412. This can turn on transfer gate 422. At the same time, logic high can be applied to the control gate of transistor 410 and a logic low (through inverter 403) can be applied to the control gate of transistor 411. This can turn off transfer gate 424. With read clock signal RCLOCK logic high, inverter 401 can output a logic low. Because transfer gate 422 can be turned on, the logic low can be applied to the input of inverter 405 and NAND gate 408. In this manner, control circuit 430 may keep transfer gate 422 enabled as long as a latch node (output of transfer gate 422) remains low. With transfer gate 422 providing logic low to the input of inverter 405, the output of inverter 405 provides logic high to an input of NAND gate 406. In this manner, NAND gate 406 can be enabled.

Next, at time t2, address set signal ADDSET may transition to logic low. The transition of ADDSET to logic low can indicate the beginning of a serial access read and may also indicate the beginning of the latency period.

When ADDSET transitions to logic low, the output of inverter 402 may become logic high. This logic high can be applied to an input of NAND gate 408. However, latch node (output of transfer gate 422) can remain low because read clock signal RCLOCK can remain high. Thus, the output of NAND gate 408 can remain high and transfer gate 422 can remain turned on and transfer gate 424 can remain turned off. The logic high output of inverter 402 may also be applied to NAND gate 406. Thus, period output circuit 440 can produce a control signal RCL, which can be logic low. This can indicate a latency period of a serial access read operation as shown in FIG. 5.

Next, at time t3, read clock signal RCLOCK can transition low. The first low transition of read clock signal RCLOCK after a load address operation may indicate a serial access period of a serial access read operation.

When read clock signal RCLOCK transitions low, inverter 401 can have a logic high output. This can be applied to transfer gate 422, which can be turned on. Thus, latch node (output of transfer gate 422) can become logic high. This logic high can be applied to an input of NAND gate 408. The other input of NAND gate 408 can remain high because address set signal ADDSET may remain low. Thus, NAND gate 408 can produce a logic low output. This can turn transfer gate 422 off and can turn transfer gate 424 on. The high level at latch node (output of transfer gate 422) can cause the output of inverter 405 to become logic low. Thus, inverter 404 can produce a logic high output. With transfer gate 424 turned on, the logic high at latch node (output of transfer gate 422) can be latched by a flip-flop formed by inverters (404 and 405) and transfer gate 424. With the output of inverter 405 logic low applied to NAND gate 406, period output circuit 440 can produce a control signal RCL, which can be logic high. This can indicate a serial access period of a serial access read operation beginning at t3 as shown in FIG. 5.

In this manner, control signal RCL may remain at logic high until a subsequent address load operation takes place in order to load a new address for a subsequent serial access mode. This may be accomplished by the address set signal ADDSET in a manner similar to that shown in FIG. 5 from times t1 to t2.

Referring once again to FIG. 1, control signal RCL can indicate whether semiconductor memory device 100 is operating in a latency period or serial access period of a serial access read operation. Control signal RCL can be applied to reference voltage generator 102. Reference voltage generator 102 may generate a reference voltage REF having a first potential during the latency period and a second potential during the serial access period. The first potential may be greater than the second potential.

The reference voltage REF may be applied to a sense amplifier 110. The first potential may be greater than a mid-point of the potential swing at a sense node N306. The second potential may be less than a mid-point of the potential swing at a sense node N306.

Figure 6:
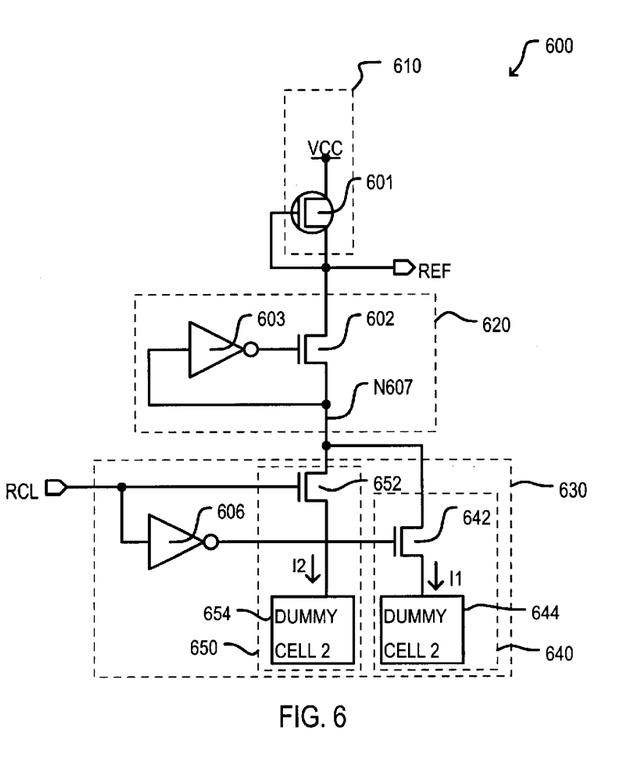
FIG. 6 is a circuit schematic diagram of a reference voltage generator according to one embodiment.

Referring now to FIG. 6, a reference voltage generator according to an embodiment is set forth in a circuit schematic diagram and given the general reference character 600.

Reference voltage generator 600 can be used as reference voltage generator 101 in the semiconductor memory device 100 illustrated in FIG. 1.

Reference voltage generator 600 can include a load circuit 610, a feedback circuit 620, and a reference selection circuit 630.

Load circuit 610 can be coupled between a supply voltage VCC and reference voltage REF. Feedback circuit 620 may be coupled between reference voltage REF and an output of reference selection circuit 630. Reference selection circuit 630 can be coupled to the input of feedback circuit 620.

Load circuit 610 may be connected between a power supply VCC and the reference voltage REF. Load circuit 610 may include a load transistor 601. Load transistor 601 may have a source connected to the power supply VCC and a drain and gate connected to reference voltage REF. Load transistor 601 may be a p-channel IGFET, as just one example.

Feedback circuit 620 may include a transistor 602 and inverter 603. Transistor 602 may have a source connected to node N607, a drain connected to reference voltage REF, and a gate connected to the output of inverter 603. Inverter 603 may have its input connected to the source of transistor 602 and an output of reference selection circuit 630. Transistor 602 may be an n-channel IGFET, as just one example.

Reference selection circuit 630 can include a first current selection circuit 640, a second current selection circuit 650 and an inverter 606.

First current selection circuit 640 can include a selection transistor 642 and a dummy cell 644. Selection transistor 642 can have a drain connected to node N607, a source connected to dummy cell 644, and a gate connected to an output of inverter 606. Selection transistor 642 can be an n-channel IGFET, as just one example. Inverter 606 can receive control signal RCL as an input. The signal line connecting selection transistor 642 and dummy cell 644 may be a dummy digit line.

Second selection circuit 650 can include a selection transistor 652 and a dummy cell 654. Selection transistor 652 can have a drain connected to node N607, a source connected to dummy cell 654, and a gate connected to control signal RCL. Selection transistor 652 can be an n-channel IGFET, as just one example. The signal line connecting selection transistor 652 and dummy cell 654 may be a dummy digit line.

The operation of voltage reference generator 600 will now be described.

Feedback circuit 620 can be used to limit the voltage of node N607. If node N607 has a potential above the threshold voltage of inverter 603, a low logic level may be applied to the control gate of transistor 602, thus turning it off. This can limit the potential of node N607 to the threshold voltage of inverter 603 and may set this level as a quiescent operating point. This may conserve power.

The operation of reference voltage generator 600 when semiconductor memory device 100 is operating in a serial access period of a serial access read operation will now be explained.

During the serial access period, control signal RCL can be logic high. With control signal RCL at logic high, selection transistor 652 may be turned on and selection transistor 642 may be turned off. With selection transistor 652 turned on, a current I2 may flow through dummy cell 654. The current I2 may flow through transistor 602 and load circuit 610. In this manner, reference voltage REF may have a potential determined by the magnitude of current I2 flowing through dummy cell 654. Dummy cell 654 may be designed to generate a reference voltage VREF that may be lower than the mid-point of the voltage swing of sense node N306 (shown in FIG. 3) of sense amplifier 110. The voltage swing of sense node N306 can be determined by the voltage when an OFF-cell (maximum voltage) may be selected and an ON-cell (minimum voltage) may be selected.

Now the operation of reference voltage generator 600 when semiconductor memory device 100 is operating in a latency period will be explained.

During the latency period, control signal RCL can be logic low. With control signal RCL at logic low, selection transistor 642 may be turned on and selection transistor 652 may be turned off. With selection transistor 642 turned on, a current I1 may flow through dummy cell 644. The current I1 may flow through transistor 602 and load circuit 610. In this manner, reference voltage REF may have a potential determined by the magnitude of current I1 flowing through dummy cell 644. Dummy cell 644 may be designed to generate a reference voltage VREF that may be higher than the mid-point of the voltage swing of sense node N306 (shown in FIG. 3) of sense amplifier 110. The voltage swing of sense node N306 can be determined by the voltage when an OFF-cell (maximum voltage) may be selected and an ON-cell (minimum voltage) may be selected.

It should be noted that the magnitude of current I2 may be greater than current I1. Thus, dummy cell 654 may be more conductive than dummy cell 654.

In this manner, reference voltage generator 600 may provide a reference voltage REF having a different potential based on whether a semiconductor memory device 100 is operating in a latency period or a serial access period of a serial access read operation. By varying the above-mentioned dummy cells (644 and 654), the potential of reference voltage REF may be set to a desired level for both the serial access period and latency period.

It is understood that the embodiments described above are exemplary and the present invention should not be limited to those embodiments. Specific structures should not be limited to the described embodiments.

It is understood that the latency period can be a first bit access during a serial read operation and the serial access period can be subsequent bit accesses. Also, that the latency period can be a first bit access during a burst access operation and the serial access period can be subsequent bit accesses, to name just two examples.

It is also understood that the latency period can refer to an access in which the first bit is read after a word line has been energized and a serial read operation can be the reading of a subsequent bit. Also, the column address in the serial read period may be applied externally and may not necessarily be from a counter.

Although semiconductor memory device that is a read only memory was discussed, it is understood that the embodiments are applicable to any semiconductor memory device that may have a read operation in which a two read periods may benefit from having a sense amplifier receiving differing reference voltages.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor memory device having a read mode including a latency period and a serial access period, comprising:

a sense amplifier receiving a reference voltage for comparing with a data signal representing a memory cell data bit; and the reference voltage has a first potential during the latency period and a second potential during the serial access period.

2. The semiconductor memory device according to claim 1, wherein the reference voltage is set to a higher potential in the latency period than in the serial access period.

3. The semiconductor memory device according to claim 1, including:

a reference voltage generator receiving a control signal and generating the first potential when the control signal is in a first logic level and generating the second potential when the control signal is in a second logic level.

4. The semiconductor memory device according to claim 3, including:

the reference voltage generator includes a load circuit coupled between a power supply voltage and the reference voltage, the load circuit having a first load impedance when the control signal is in the first logic level and a second load impedance when the control signal is in the second logic level.

5. The semiconductor memory device according to claim 4, wherein the first load impedance is less than the second load impedance.

6. The semiconductor memory device according to claim 3, wherein the reference generation circuit includes a load circuit providing the reference voltage according to a load current and a first selection circuit for providing a first load current through the load circuit and a second selection circuit for providing a second load current through the load circuit.

7. The semiconductor device according to claim 6, wherein the first load current is less than the second load current and the first selection circuit is activated when the control signal is in the first logic level and the second selection circuit is activated when the control signal is in the second logic level.

8. The semiconductor memory device according to claim 1, wherein the semiconductor memory device is a read only memory.

9. A semiconductor memory device having a read operation with a first bit access and a subsequent bit access, comprising:

a sense amplifier receiving a reference voltage and a data signal and providing a data output based on a potential difference, the reference voltage having a first potential for the first bit access and a second potential for a subsequent bit access.

10. The semiconductor memory device according to claim 9, wherein the first potential is greater than the second potential.

11. The semiconductor memory device according to claim 9, wherein the data signal has a switching range based on a first data potential when reading a memory cell having a first state and a second data potential when reading a memory cell having a second state and the first potential is greater than a mid-point between the first data potential and the second data potential.

12. The semiconductor memory device according to claim 9, wherein the data signal has a switching range based on a first data potential when reading a memory cell having a first state and a second data potential when reading a memory cell having a second state and the second potential is lower than a mid-point between the first data potential and the second data potential.

13. The semiconductor memory device according to claim 9, wherein the first bit access during the read operation is the first bit accessed from a row of bits coupled to an energized word line.

14. The semiconductor memory device according to claim 13, wherein the subsequent bit access during the read operation is the subsequent bit accessed from the row of bits coupled to the energized word line.

15. A semiconductor memory device having read operation in which bits are successively read wherein the read operation includes a first period and a second period, comprising:

a differential amplifier providing a data output based on a potential difference between a reference potential and a data signal, the reference potential having a first potential during the first period and a second potential during the second period.

16. The semiconductor memory device according to claim 15, further including:

a control circuit providing a control signal having a first logic level indicating the first period and a second logic level indicating the second period; and a reference generator coupled to receive the control signal and provide the reference potential at the first potential when the control signal is at the first logic level and at the second potential when the control signal is at the second logic level.

17. The semiconductor memory device according to claim 16, wherein the control circuit is coupled to receive an address latch signal and a clock signal.

18. The semiconductor memory device according to claim 16, wherein the control signal transitions from the first logic level to the second logic level at the first transition of an external read clock signal during the first period.

19. The semiconductor memory device according to claim 18, wherein the control circuit includes a latch circuit that is activated by the first transition.

20. The semiconductor memory device according to claim 16 wherein the control circuit detects an external address load operation to indicate a beginning of the first period.

\* \* \* \* \*